United States Patent
Christoffersson et al.

(10) Patent No.: US 7,348,904 B2
(45) Date of Patent: Mar. 25, 2008

(54) SELECTIVE UPDATING OF COMPRESSION DICTIONARY

(75) Inventors: Jan Christoffersson, Luleå (SE); Hans Hannu, Luleå (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 671 days.

(21) Appl. No.: 10/974,033

(22) Filed: Oct. 27, 2004

(65) Prior Publication Data

US 2005/0185677 A1     Aug. 25, 2005

Related U.S. Application Data

(60) Provisional application No. 60/545,470, filed on Feb. 19, 2004.

(51) Int. Cl.
H03M 7/00    (2006.01)

(52) U.S. Cl. .................. 341/106; 341/60; 341/107

(58) Field of Classification Search .................. 341/51, 341/60, 106, 107
See application file for complete search history.

(56) References Cited

U.S. PATENT DOCUMENTS

| | | | | |
|---|---|---|---|---|
| 5,617,552 | A | * | 4/1997 | Garber et al. .................. 711/1 |
| 6,121,903 | A | * | 9/2000 | Kalkstein ...................... 341/63 |
| 6,414,610 | B1 | * | 7/2002 | Smith ........................... 341/106 |

(Continued)

FOREIGN PATENT DOCUMENTS

EP          1 376 878 A1     1/2004

OTHER PUBLICATIONS

Nordberg et al, "Improving SigComp Performance Through Extended Operations", Vehicular Technology Conference, 2003, VTC 2003-Fall, IEEE 58th Oct. 6-9, 2003, vol. 5, pp. 3425-3428.

(Continued)

Primary Examiner—Linh Nguyen
(74) Attorney, Agent, or Firm—Nixon & Vanderhye, P.C.

(57) ABSTRACT

A telecommunications network comprises a sending entity (22) and a receiving entity (24) which communicate over a radio interface (26). The sending entity (22) comprises a compressor (40) and a message formatter (34). The compressor (40) in turn comprises a sending entity compression dictionary (60) and dictionary update decision logic (62). The compressor (40) compresses a message to obtain a compressed message to be sent over the radio interface (26) to the receiving entity (24) and also determines a compression factor for the message. The compression factor is based on similarity of the message to contents of the sending entity compression dictionary. The dictionary update decision logic (62) makes a decision whether the compression factor justifies updating of a receiving entity decompression dictionary (70). The message formatter (34) includes, in the compressed message, an update indication regarding the decision. The receiving entity (24) has a decompressor (50) which comprises the receiving entity decompression dictionary (70) and decompression dictionary update determination logic (72). The decompressor (50) decompresses the compressed message to obtain a decompressed message. The decompression dictionary update determination logic (72) uses the update indication to ascertain whether to use the decompressed message to update the receiving entity decompression dictionary (70). In one example illustrative embodiment, the compressor (40) uses a SigComp compression scheme to compress the message to obtain the compressed message, and the message formatter (34) sets a bit flag in a SigComp portion of the compressed message as the update indication.

33 Claims, 4 Drawing Sheets

U.S. PATENT DOCUMENTS

| | | | |
|---|---|---|---|
| 6,597,812 B1 * | 7/2003 | Fallon et al. | 382/232 |
| 6,643,815 B1 * | 11/2003 | Davis et al. | 714/758 |
| 6,707,400 B2 | 3/2004 | Christofferson et al. | |
| 6,883,035 B2 * | 4/2005 | Hannu et al. | 709/247 |
| 2002/0057715 A1 | 5/2002 | Hannu et al. | |
| 2002/0058501 A1 | 5/2002 | Hannu et al. | |
| 2002/0059462 A1 | 5/2002 | Hannu et al. | |
| 2003/0025621 A1 | 2/2003 | Christoffersson et al. | |
| 2003/0030575 A1 * | 2/2003 | Frachtenberg et al. | 341/51 |
| 2003/0179114 A1 | 9/2003 | Kampf | |
| 2004/0008650 A1 | 1/2004 | Le et al. | |
| 2004/0047301 A1 | 3/2004 | Poikselka et al. | |
| 2004/0059835 A1 | 3/2004 | Liu et al. | |
| 2007/0150497 A1 * | 6/2007 | De La Cruz et al. | 707/101 |

OTHER PUBLICATIONS

International Search Report mailed May 11, 2005 in corresponding PCT application No. PCT/SE2005/000122.

Price et al, Signalling Compression (SigComp), RFC 3320, Network Working Group, Jan 2003.

Tech Spec., 3$^{rd}$ Generation Partnership Project; Tech. Spec. Group Services and Systems Aspects; Network Architecture (Release 5), 3GPP TS 23.002, V5.12.0 (Sep. 2003).

Tech Spec., 3$^{rd}$ Generation Partnership Project; Tech. Spec. Group Services and Systems Aspects; IP Multimedia Subsystems (IMS); Stage 2 (Release 6), 3GPP TS 23.228 V6.7.0 (Sep. 2004).

OMA PoC User Plane, OMA-UP-POC=V0_1-20041005-D,Draft Version 1.0.9 Oct. 2004.

* cited by examiner

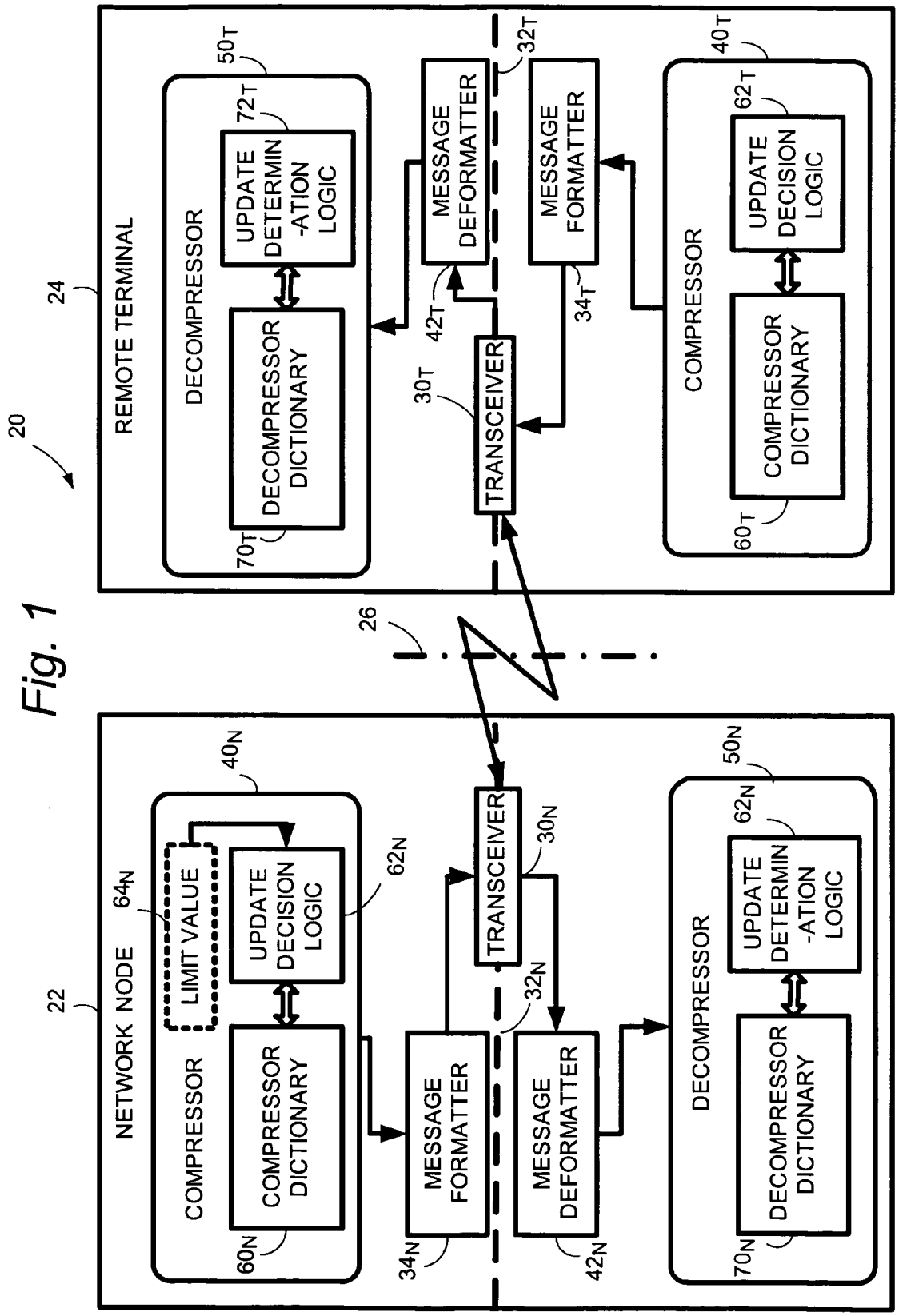

SELECTIVE UPDATING OF COMPRESSION DICTIONARY

This application claims the benefit and priority of U.S. Provisional Patent application 60/545,470, filed Feb. 19, 2004, entitled "SigComp Dictionary Updates Based On Compression Factors", which is incorporated herein by reference in its entirety.

BACKGROUND

1. Field of the Invention

The present invention pertains to the updating of a dictionary utilized in compression of information, such as information transmitted over a radio or air interface, for example.

2. Related Art and Other Considerations

Push-to-talk over Cellular (PoC) is being developed for handsets in networks such as GSM/GPRS networks, EDGE networks, UMTS, and code division multiple access (CDMA) systems. Push to talk over Cellular (PoC) is currently being standardized and agreed upon in an industry consortium known as the Open Mobile Alliance (OMA) forum. See, e.g., OMA PoC User Plane, OMA-UP-POC=V0_1-20041005-D, Draft Version 1.0.9 October 2004, incorporated herein by reference, and http://www.openmobilealliance.com/tech/wg_committees/poc.htm, PoC is basically a voice chat for cellular telecommunication systems. PoC provides quick one-to-one or group communication, providing something like a short instant messaging service which feels like "walkie talkies".

PoC enabled handsets will most likely be equipped with a PoC-button. The PoC button may (for example) be: a dedicated hardware button; an assigned button on a standard keypad; or, a software button used in e.g. pressure sensitive screens. When the PoC button is pressed, the handset is connected directly to another user or user group. In the first releases of PoC provide half-duplex service, although full duplex may be available at a later stage.

One of the important features that PoC is expected to support is a service known as "Presence". The Presence service allows a user to obtain information about the status of one or several users in the user's contacts list whom the user has selected, included, or designated for the Presence service. The Presence information is sent to the user as Presence update messages which take the form of Session Initiation Protocol (SIP) messages. These Presence update messages may be sent according to different principles, e.g. using push or pull strategies.

As an aside, Session Initiation Protocol (SIP) is an application layer protocol for establishing, modifying, and terminating multimedia sessions or calls. These sessions may include Internet multimedia conferences, Internet telephony, and similar applications. As is understood in this art, SIP can be used over either the Transmission Control Protocol (TCP) or the User Datagram Protocol (UDP). SIP is described in such publications as: (1) Rosenberg, J. et. Al., "SIP: Session Initiation Protocol", RFC3261, Internet Engineering Task Force, June 2002; and (2) Handley, M., Schulzrinne, H., Schooler, E. and Rosenberg, J., SIP: Session Initiation Protocol, IETF RFC 2543, 2000), both of which are incorporated herein by reference in their entirety.

SIP is an example of an Internet Protocol (IP). Other examples of Internet Protocols include Real Time Streaming Protocol (RTSP) and Session Description Protocol (SDP). Real Time Streaming Protocol (RTSP) is an application level protocol for control of delivery of data with real-time properties, such as audio and video data. RTSP may also be used with UDP, TCP, or other protocols as a transport protocol. Session Description Protocol (SDP) is used to advertise multimedia conferences and communicate conference addresses and conference tool-specific information. SDP is also used for general real-time multimedia session description purposes. SDP is carried in the message body of SIP and RTSP messages. SIP, RTSP, and SDP are all ASCII text based using the ISO 10646 character set in UTF-8 encoding.

A disadvantage with the Internet Protocol is the relatively large overhead the IP protocol suite introduces due to large headers and text-based signaling protocols. Yet it is very important in cellular systems to use the scarce radio resources in an efficient manner. In cellular systems it is important to support a sufficient number of users per cell, otherwise implementation and operation costs will be prohibitive. Frequency spectrum, and thus bandwidth, is a costly resource in cellular links and should be used efficiently to maximize system resources.

When access occurs over narrow band cellular links, compression of the protocol messages is needed to meet quality of service requirements, such as set-up time and delay. Compression of traffic over a radio link (e.g., air interface), such as from a wireless user terminal to a core network, is greatly desirable.

As currently proposed, PoC uses a compression scheme known as SigComp to compress SIP messages. SigComp is described in, e.g., the following documents (all of which are incorporated herein by reference in their entireties: Price, R. et al., "Signaling Compression (SigComp)", Internet Engineering Task Force (IETF) RFC 3320, Internet Engineering Task Force, January 2003; Hannu, H. et al., "Signaling Compression (SigComp)—Extended Operations", Internet Engineering Task Force (IETF) RFC 3321, December 2002; US Patent Publication US 2004/0047301.

SigComp includes a simple protocol and a Universal Decompressor Virtual Machine (UDVM). The protocol part of SigComp defines (for example) a message format and a set of rules that describe how to load information into the UDVM. The UDVM provides the decompressor functionality of SigComp. Any compressed message can be decompressed provided that the UDVM is loaded with the correct set of instructions to interpret the format of the compressed data. Further, a SigComp compressor endpoint has the ability to save information at the remote receiving decompressor endpoint in the form of states. The states are typically information from previous messages used to update a dictionary or codebook used by the compression algorithm. These states can then be retrieved by the UDVM as new compressed messages arrive.

One method for implementing a binary compression scheme is the use of dictionary based compression techniques. In general, a dictionary compression scheme uses a data structure known as a dictionary to store strings of symbols which are found in the input data. The scheme reads in input data and looks for strings of symbols which match those in the dictionary. If a string match is found, a pointer or index to the location of that string in the dictionary is output and transmitted instead of the string itself. If the index is smaller than the string it replaces, compression will occur. A decompressor contains a representation of the compressor dictionary so that the original string may be reproduced from the received index.

Binary compression algorithms, such as Deflate and LZSS, use such a dictionary, which essentially is a buffer or memory which contains data that is referenced in the compressed message. Deflate is described, e.g., by Deutsch, P. et al., "DEFLATE Compressed Data Format Specification Version 1.3", RFC 1952, Internet Engineering Task Force, May 1996. LZSS is described, e.g., by Storer, J. A. and Szimanski, T. G., "Data compression Via Textual Substitutions", *Journal of the ACM* 29, 1982.

Basically, the foundation of dictionary compression is pattern matching and substitution, i.e. finding and replacing groups of consecutive symbols (strings) with an index into a dictionary. This results in compression if the representation of the index is shorter than the string it replaces. Dictionary compression schemes are taught in one or more of the following, all of which are incorporated herein by reference in their entirety: U.S. patent application Ser. No. 09/814,407, filed Mar. 21, 2001 by Hannu et al. entitled "Communication System And Method Utilizing Request-Reply Communication Patterns for Data Compression" (see also US Patent Publication US2002/0057715); U.S. patent application Ser. No. 09/814,268, filed Mar. 21, 2001 by Hannu et al. entitled "System And Method For Communicating With Temporary Compression Tables" (see also US Patent Publication US2002/0058501); U.S. patent application Ser. No. 09/814, 406, filed Mar. 21, 2001 by Hannu et al. entitled "Static Information Knowledge Used With Binary Compression Methods" (see also US Patent Publication US2002/0059462); U.S. Pat. No. 6,707,400 by Christoffersson et al. entitled "Method and Apparatus For Fast Longest Match Search".

Compression performance depends to a large extent on the contents of the dictionary that has been saved as a SigComp state. In the most frequently used compression mode, i.e., dynamic compression, the dictionary is updated as new messages are compressed and sent. The dictionary is typically updated by adding the last message to the circular buffer that contains the dictionary.

Thus, when dynamic compression is used in SigComp, the old parts of the dictionary are shifted out when the dictionary is updated due to limited amount of memory in the dictionary. For some aspects of PoC the shifting of the dictionary contents does not cause a substantial problem. For example, for compression of SIP invite sessions (for an already established PoC session) for which SigComp has been optimized, shifting of dictionary contents is of little concern (assuming that the dictionary is of reasonably large size) since the newer parts of the dictionary typically contain more recent and more useful strings. For SigComp, the decompression memory and the state memory need to be at least 4 Kbytes to obviate the concern.

On the other hand, the shifting of dictionary contents can cause a problem under some circumstances. For example, mundane signaling related to the PoC Presence Service may flush from the dictionary earlier strings which are more useful or significant for decompression purposes. Consider, for example, what happens when a Presence Server, a node of the PoC service-providing network, sends the aforementioned Presence update messages using the SIP "Notify" method to a remote terminal (e.g., wireless terminal, mobile station, mobile terminal, etc.). The remote terminal acknowledges receipt of a SIP Presence update message by, for example, returning a SIP 200 OK message. As a consequence of doing so, the SigComp dictionary may also be updated. These Presence update messages can be quite frequent (at least compared to the session initiation signaling) and also occur during the entire time that the user is registered with the Presence Service.

Old content of the dictionary is shifted out with receipt of each Presence update message. The amount of old content which is shifted out depends on the size of the message and the size of the state memory. With such shifting, there is a risk that useful information is shifted out and deleted from the dictionary. FIG. 5 illustrates consequences of dictionary updates upon occasion of successive message receipt instances for an example illustrative dictionary when dynamic compression is used for compression of Presence-related signaling. The Presence update messages such as NOTIFY1, NOTIFY2, NOTIFY3, . . . etc. in FIG. 5 may be a list of users' status. The lists of these Presence update messages are expected to be more or less identical from message to message, e.g., the lists of consecutive messages are not likely to vary significantly and in many cases not at all. Thus, when the dynamic compression mode is used in such a case, the dictionary will end up being a number of almost identical copies of the status list or SIP 200 OKs, as shown by the last instance or update in FIG. 5. Should the user then initiates a new session (a new SIP Invite dialogue), the dictionary will be filled with less useful strings (e.g., the NOTIFY messages). These NOTIFY messages are typically not helpful for decompressing messages of a new session, rendering the dictionary less useful with the result that the compression efficiency is not as high as it potentially could be. The result is that longer time is required for signaling for setting up this new session than would have been the case if the dictionary had been left unchanged (e.g., if the dictionary had not been flushed with the Presence update NOTIFY messages). This is a serious disadvantage, since short set up time is one of the most important design goals of the PoC standard.

What is needed, therefore, and an object of the present invention, is provision of apparatus and method for judiciously handling compression dictionary updates when receiving relatively invariant messages across a radio interface.

BRIEF SUMMARY

A telecommunications network comprises a sending entity and a receiving entity which communicate over a radio interface. The sending entity comprises a compressor and a message formatter. The compressor in turn comprises a sending entity compression dictionary and dictionary update decision logic. The compressor compresses a message to obtain a compressed message to be sent over the radio interface to the receiving entity and also determines a compression factor for the message. In general, the compression factor is defined as (Uncompressed message size)/(Compressed message size). Hence, the compression factor is based on similarity of the message to contents of the sending entity compression dictionary. A high value for the compression factor (which occurs when the message has been greatly compressed) implies that the dictionary must contain most of the strings that are in the message. The dictionary update decision logic makes a decision whether the compression factor justifies updating of a receiving entity decompression dictionary. The message formatter includes, in the compressed message, an update indication regarding the decision.

The receiving entity has a decompressor which comprises the receiving entity decompression dictionary and decompression dictionary update determination logic. The decompressor decompresses the compressed message to obtain a decompressed message. The decompression dictionary update determination logic uses the update indication to ascertain whether to use the decompressed message to update the receiving entity decompression dictionary.

In one example illustrative embodiment, the compressor uses the SigComp compression scheme to compress the message to obtain the compressed message. In such example illustrative embodiment, a bit flag or the like is set in the "remaining SigComp message" field of the SigComp message as the update indication.

In an example embodiment, the compressor dictionary update decision logic makes the decision whether the compression factor justifies updating of the receiving entity decompression dictionary by comparing the compression factor to a limit value. The limit value can be a fixed value. Alternatively, the update decision logic can adapt the limit value in accordance with a compression history, e.g., adapt the limit value based on an average compression factor over a period of time.

A non-limiting example environment of implementation of the foregoing network is a telecommunications network which has a Push-to-talk over Cellular (PoC) feature. As such, the network comprises both a sending entity and a receiving entity which communicates over a radio interface with the sending entity. The sending entity sends, e.g., a Presence update message to the receiving entity over the radio interface. The sending entity comprises a compressor with dictionary update decision logic and a message formatter. The compressor compresses the message to obtain a compressed message which is ultimately to be sent over the radio interface to the receiving entity, and also determines a compression factor for the message. The update decision logic determines whether the compression factor for the message justifies updating of the receiving entity decompression dictionary. For a Presence update message, probably excluding the first Presence update message, or any other message having a sufficiently high compression factor, the message formatter includes, in the compressed message, an update indication that a receiving entity decompression dictionary is not to be updated for the message. Thus, a Presence update message is one of the messages that includes an update indication that a receiving entity decompression dictionary is not to be updated.

The receiving entity which participates in the PoC service has a decompressor. The decompressor comprises the receiving entity decompression dictionary and the decompressor dictionary update determination logic. The decompressor decompresses the compressed message to obtain a decompressed message. On the basis of the update indication, the update determination logic only selectively updates the receiving entity decompression dictionary. For example, the update determination logic, on the basis of the update indication, does not update the receiving entity decompression dictionary with respect to the Presence update message.

As in the generic embodiment, in an example implementation the compressor of the PoC-compatible embodiment can operate by determining a compression factor for each of the messages based on similarity of each message to contents of a sending entity compression dictionary. In such implementation, the update decision logic can make a decision whether the compression factor justifies updating of a receiving entity decompression dictionary, with the message formatter including in a respective compressed message the update indication regarding the decision. Then, at the receiving entity, the update determination logic uses the update indication to ascertain whether to use the decompressed message to update the receiving entity decompression dictionary.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 1 is a schematic view of a network node and a remote terminal in communication over a wireless (radio) interface.

DETAILED DESCRIPTION OF THE DRAWINGS

Figure 3:
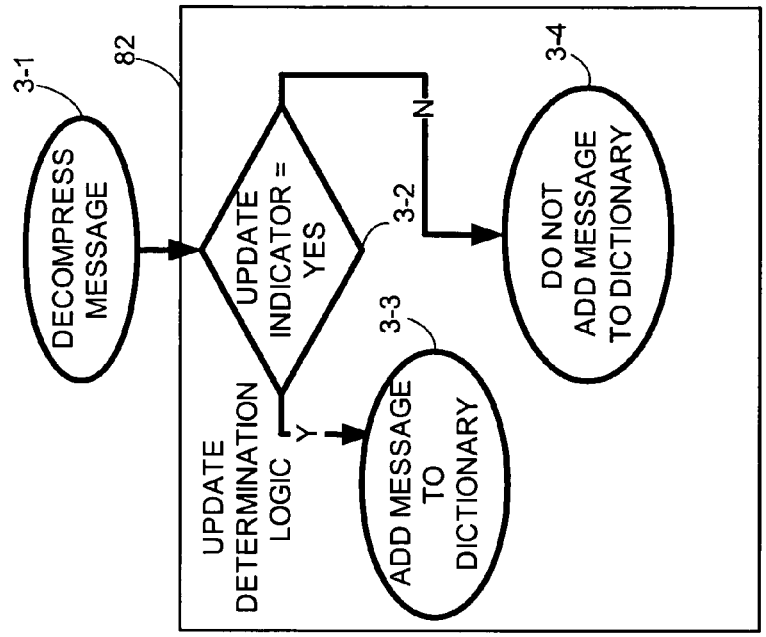
FIG. 3 is a flowchart showing basic, representative steps performed by a receiving node relative to updating of a data compression dictionary.

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

FIG. 1 illustrates in simplified fashion a telecommunications network 10 which includes a representative network node 22 and a representative remote terminal 24. The network node 22 and remote terminal 24 communicate with one another over a radio or "air" interface 26. Both network node 22 and remote terminal 24 have a transceiver 30 for facilitating wireless or radio communication over radio interface 26.

While network node 22 and radio interface 26 have myriad other elements and functionalities, as understood by the person skilled in the art, FIG. 1 illustrates only those elements and functionalities necessary or helpful for illustrating the dictionary updating techniques described herein. Moreover, for described elements of network node 22 and remote terminal 24 having the same name or general function, the same reference numeral is often used in a generic sense. For example, both network node 22 and remote terminal 24 have a transceiver 30. Yet as shown in FIG. 1, the elements and functionalities belonging to network node 22 are suffixed with a "N" suffix, while the elements and functionalities belonging to remote terminal 24 are suffixed with a "T" suffix.

Each of network node 22 and remote terminal 24 have a sending side and a receiving side. In FIG. 1, the sending side of network node 22 is shown above the broken line 32N; the receiving side of network node 22 is shown below the broken line 32N. Conversely, merely for sake of convenience, the sending side of remote terminal 24 is shown below broken line 32T; the receiving side of remote terminal 24 is shown above the broken line 32N. Other than transceiver $30_N$, the sending side of network node 22 is one example of what is herein considered a "sending entity"; the receiving side of remote terminal 24 is one example of what is herein considered a "receiving entity".

In each of network node 22 and remote terminal 24, the transceiver 30 is connected to receive message information from a message formatter 34 of its sending side. A compressor 40 is connected on the sending side to supply the message formatter 34 with compressed data for formatting into outgoing messages. The compressor 40 is fed with data from other elements of the node/terminal, such feeding elements in various implementations being, for example, a buffer or some other allocated memory which is accessible by the compressor 40 and to which an application or the like (e.g., SIP stack) writes or puts the uncompressed message.

The transceiver 30 of both the network node 22 and the remote terminal 24 is also connected to forward message information (received over radio interface 26) to a message deformatter 42 situated on its receiving side. A decompressor 50 is connected on the receiving side to receive deformatted messages from message deformatter 42. The decompressor 50 is connected to supply decompressed data to other elements of the node/terminal. Node/terminal elements which may receive such decompressed data from decompressor 50 may be, for example, a buffer or some other allocated memory which is fed by the decompressor 40 and from which an application or the like (e.g., SIP stack) reads or obtains the uncompressed message.

As illustrated in FIG. 1, in each of network node 22 and remote terminal 24 the compressor 40 comprises sending entity compression dictionary 60 and dictionary update decision logic 62. As an optional feature, the dictionary update decision logic 62 can be supplied with a limit value 64, which can be obtained from a memory device or otherwise be stored or configured in software or firmware. Similarly, in each of network node 22 and remote terminal 24 the decompressor 50 comprises receiving entity decompression dictionary 70 and dictionary update determination logic 72.

The compressor 40 and decompressor 50 of the network node 22 and remote terminal 24 are generically shown as function blocks of the node/terminal. Those skilled in the art will appreciate that the functions of compressor 40 and decompressor 50, and the sub-functions thereof, may be implemented using individual hardware circuits, using software functioning in conjunction with a suitably programmed digital microprocessor or general purpose computer, using an application specific integrated circuit (ASIC), and/or using one or more digital signal processors (DSPs).

It should be understood that the technique of performing compression/decompression with selective dictionary updating as described herein need not be performed at nodes or terminals identically structured as those shown in FIG. 1. Rather, various non-compression functions and non-decompression functions, such as message transmission and reception, for example, can be distributed or separated to other nodes or devices, or even networks (e.g., core network and radio access network). Moreover, even the compression functions of the sending entity and the decompression functions of the receiving entity can be distributed over plural nodes and/or devices, if desired.

In view, e.g., of the foregoing, the term "sending entity" as employed herein refers to any node or unit, or portion of node or unit, which performs, either in whole or in part, the dictionary update decisions described herein. In particular, a sending entity(whether distributed or centralized) at least performs functions comparable to those of dictionary update decision logic 62. Thus, the term "sending entity" is not to be confused with or equated to "transmitting entity", as the node or device which hosts the sending entity may or may not also include a device, such as transceiver $30_N$, for immediate transmission of a message to a receiving entity. For example, a "sending entity" may be located more than one node or network interface away from a receiving entity, such as in a core network, for example. Further, mention herein that a sending entity communications over a radio interface to a receiving entity does not require that the sending entity be situated in a node or location which borders the radio interface. Rather, such mention refers more generally to the fact that the sending entity is involved in preparation (and particularly a compression dictionary update decision) of information that is included in or utilized by a message that at least eventually is transmitted over the air interface (possibly through one or more downstream nodes or networks).

Figure 2:
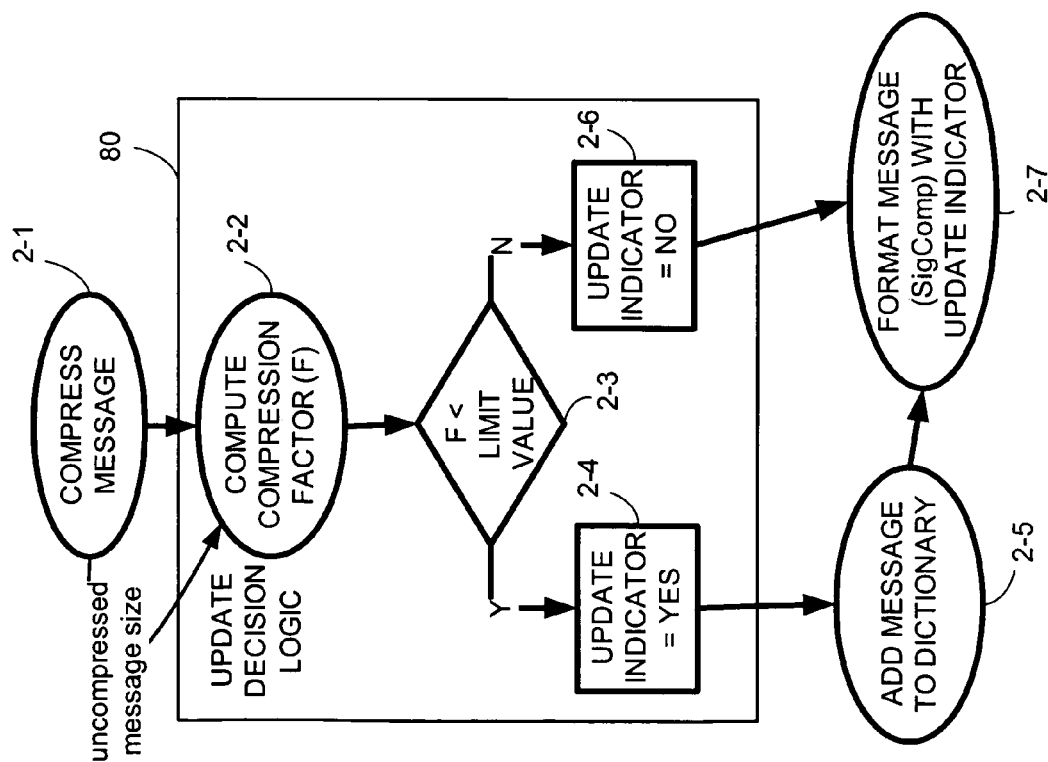
FIG. 2 is a flowchart showing basic, representative steps performed by a sending node relative to updating of a data compression dictionary.

Basic, representative, example steps performed on a sending side of a device such as network node 22 or remote terminal 24 in conjunction with transmission of a compressed message are illustrated in FIG. 2. It should be understood that the steps of FIG. 2 represent both steps performed by the sending side of network node 22 when network node 22 is sending a message, and steps performed by the sending side of remote terminal 24 when remote terminal 24 is sending a message. For the illustrated example embodiment, the steps framed by broken line box 80 are those primarily performed by dictionary update decision logic 62.

Step 2-1 of FIG. 2 shows compressor 40 compressing a message and thereby obtaining a compressed message to be sent over radio interface 26 to a receiving entity. The message which is subjected to the compression may be obtained from, e.g., an application or SIP stack, such as a PoC/presence application utilizing the SIP protocol. In conjunction with its compression operation, as step 2-2 the dictionary update decision logic 62 of compressor 40 also computes or determines a compression factor (F) for the message. Determination/computation of the compression factor (F) is based on similarity of the message to contents of the sending entity compression dictionary 60.

In general, the compression factor is defined as (Uncompressed message size)/(Compressed message size). For this reason, FIG. 2 shows the uncompressed message size being communicated to the compression factor computation. Thus, the compression factor is related to the similarity of the message to the dictionary. A high value for the compression factor (which occurs when the message has been greatly compressed) implies that the dictionary must contain most of the strings that are in the message. The only other way of obtaining an unusually high compression factor is if the message itself contains a lot of repeated strings, but this is not the case for typical SIP messages carrying information related to setting up, modifying or terminating sessions, e.g. real-time sessions such as PoC or VoIP.

The dictionary update decision logic 62 makes a decision whether the compression factor (F) justifies updating of a receiving entity decompression dictionary. For example, step 2-3 shows dictionary update decision logic 62 comparing the compression factor (F) [determined or otherwise computed at step 2-2] with a predetermined criteria, such as the optional limit value 64 supplied to dictionary update decision logic 62 as shown in FIG. 1.

If the compression factor (F) satisfies the predetermined criteria of step 2-3 (e.g., satisfies a predefined relationship with the limit value 64), as step 2-4 the dictionary update decision logic 62 sets the value of a UPDATE INDICATOR parameter to YES, or some other appropriate value to indicate that update of the decompression dictionary 70 of the receiving entity should be performed for the message. Then, as step 2-5, compressor 40 adds the message to sending entity compression dictionary 60.

If the compression factor (F) does not satisfy the predetermined criteria of step 2-3 (e.g., fails to satisfy the predefined relationship with the limit value 64), as step 2-6 the dictionary update decision logic 62 sets the value of a UPDATE INDICATOR parameter to NO, or some other appropriate value, to indicate that update of the decompression dictionary 70 of the receiving entity should not be performed for the message.

After the UPDATE INDICATOR parameter is appropriately set, either at step 2-4 or step 2-6, the message and the UPDATE INDICATOR parameter are applied to message formatter 34. The message formatter 34 includes the UPDATE INDICATOR parameter in the compressed message for transmission over the radio interface 26 to the receiving entity.

Basic, representative, example steps performed on a receiving side of a device such as network node 22 or remote terminal 24 in conjunction with receipt of a compressed message are illustrated in FIG. 3. It should be understood that the steps of FIG. 3 represent both steps performed by the receiving side of network node 22 when network node 22 is receiving a message, and steps performed by the receiving side of remote terminal 24 when remote terminal 24 is receiving a message. Steps framed by broken line box 82 are those primarily performed by dictionary update determination logic 72.

Step 3-1 of FIG. 3 shows decompressor 50 of the receiving entity performing decompression of a message which has been received over radio interface 26 and already deformatted by message deformatter 42. The message was deformatted by message deformatter 42 in a manner to ascertain the UPDATE INDICATOR parameter which was included (e.g., at step 2-7 of FIG. 2) in the received message. As shown by step 3-2, the dictionary update determination logic 72 of decompressor 50 examines the value of the UPDATE INDICATOR parameter, e.g., to ascertain whether its value requires or precludes updating of decompression dictionary 70. If the value of the UPDATE INDICATOR parameter is a YES value or otherwise requires updating of decompression dictionary 70, the update of decompression dictionary 70 is performed at step 3-4. On the other hand, if the value of the UPDATE INDICATOR parameter is a NO value or otherwise precludes updating of decompression dictionary 70, the update of decompression dictionary 70 is not performed as indicated by step 3-5.

In one example illustrative embodiment, the compressor 40 uses a SigComp compression scheme to compress the message to obtain the compressed message. The SigComp compression scheme is described in Price, R. et al., "Signaling Compression (SigComp)", Internet Engineering Task Force (IETF) RFC 3320, January 2003, as well as documents previously referenced herein. As explained therein, a SigComp message can have either of two formats, both formats including a field called "remaining SigComp message" which is processed by the Universal Decompressor Virtual Machine (UDVM).

In such example illustrative embodiment, a bit flag or the like is set in the "remaining SigComp message" field of the SigComp message as the update indication (e.g., UPDATE INDICATOR). The UDVM processing is performed according to instructions of a byte code provided by the compressor. The UDVM as instructed by the byte code checks the update indication (e.g., whether a bit is set at a particular position of the UDVM memory) if the UPDATE INDICATOR indicates YES then the UDVM performs a state create instruction in order to update the dictionary.

In SigComp, when a dictionary is updated a new state is saved in the state memory. This newly-saved state contains the updated dictionary, hence new information with some older information. When the state memory is full a new state save request would, in plain dynamic compression, push out an old state, hence old dictionary information.

In an example embodiment, the compressor dictionary update decision logic makes the decision whether the compression factor justifies updating of the receiving entity decompression dictionary by comparing the compression factor to the limit value. Since this limit value is an optional feature, limit value 64 is framed in broken lines in FIG. 1. The limit value can be a fixed value. Alternatively, the update decision logic can adapt the limit value in accordance with a compression history, e.g., adapt the limit value based on an average compression factor over a period of time.

Figure 4:
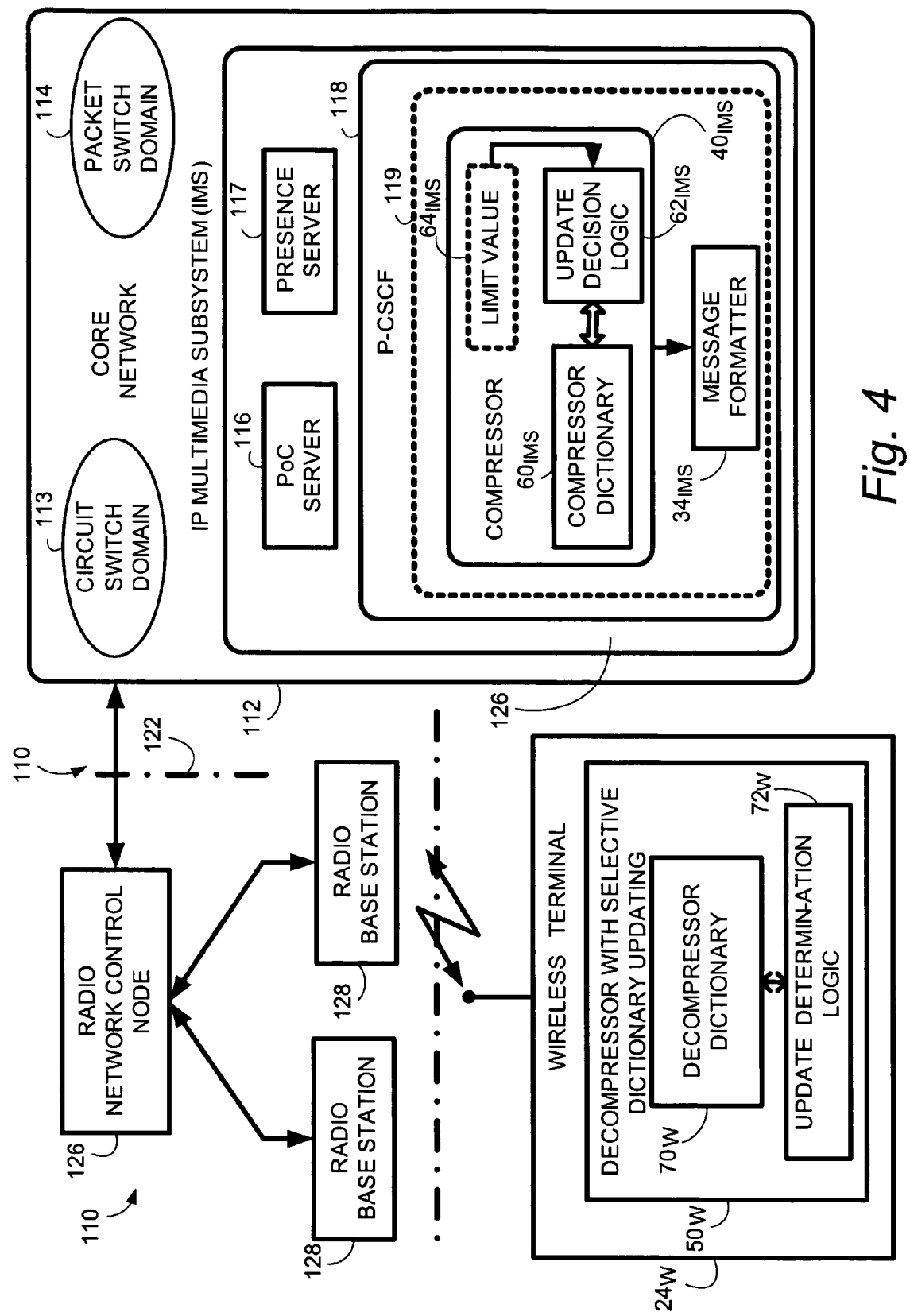
FIG. 4 is a schematic view of a telecommunications system which provides a Presence message through a network node to a remote terminal.
Figure 5:
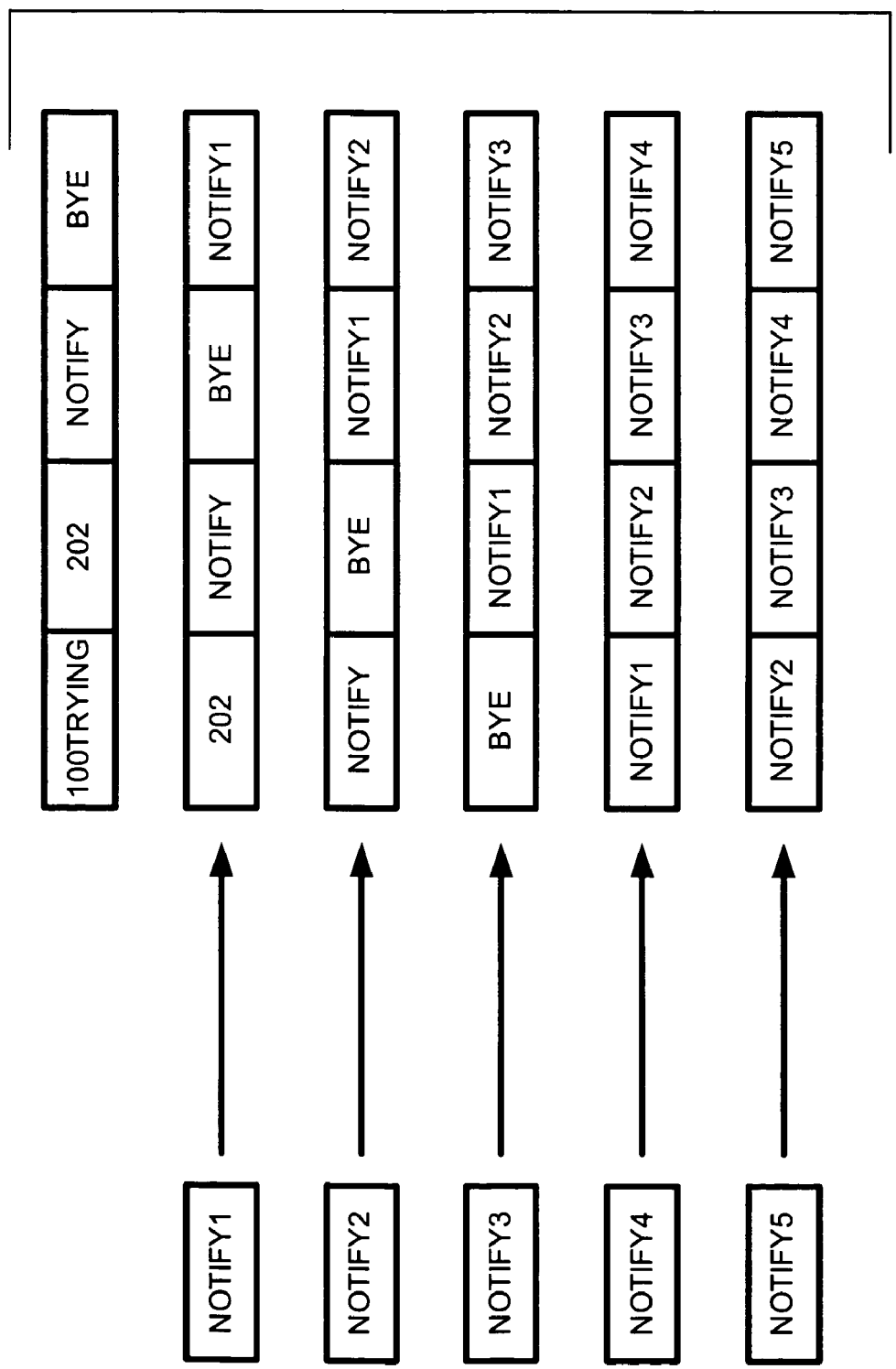
FIG. 5 is a diagrammatic view depicting receipt of sequential PoC Notify messages and consequential corresponding update of a compression dictionary in accordance with conventional practice.

A non-limiting example environment of implementation of the foregoing network is a telecommunications network 100 such as that shown in FIG. 4 which has a Push-to-talk over Cellular (PoC) feature. The example telecommunications network 100 includes both a radio access network 110 and a core network 112. The core network 112 is shown as comprising a circuit switch domain 113; a packet switch domain 114; and, among other subsystems and functionalities, an IP Multimedia Subsystem (IMS) 115. The IP Multimedia Subsystem (IMS) 115 comprises all core network elements for provision of IP multimedia services comprising audio, video, text, chat, etc, and a combination of them delivered over the Packet Switched domain 114. The IP Multimedia Subsystem (IMS) 115 includes a PoC Server 116 which facilitates the Push to talk over Cellular (PoC) service previously described. The PoC Server 116 includes or is connected to a Presence Server 117 which performs the "Presence" function described above, e.g., monitoring the status of one or several other users in a user's contacts list so that Presence update messages (in the form, e.g., of Session Initiation Protocol (SIP) messages) can be sent to the Presence-subscribing user.

The IP Multimedia Subsystem (IMS) 115 also includes a Proxy-Call Session Control Function (P-CSCF) 118. The Proxy-Call Session Control Function (P-CSCF) 118 includes, e.g., the SigComp function, represented by broken line 119, as well as an unillustrated decompression functionality (understood with reference to FIG. 1). Included in the SigComp function 119 is the compressor $40_{IMS}$ which selectively updates its compressor $40_{IMS}$ in accordance with the techniques described above, as well as SigComp message formatter $34_{IMS}$ The compressor $40_{IMS}$ includes compressor dictionary $60_{IMS}$, update decision logic $62_{IMS}$, and (optionally) limit value $64_{IMS}$, all of which essentially function in the manner described as comparably numbered elements discussed previously. In the FIG. 4 embodiment, the IP Multimedia Subsystem (IMS) 115, by virtue, e.g., of its hosting of SigComp function 119, serves as the sending entity. Further details of IP Multimedia Subsystem (IMS) 115 are described in 3GPP TS 23.228 V6.7.0 (2004-09), Technical Specification Group Services and System Aspects; IP Multimedia Subsystem (IMS); Stage 2 (Release 6), which is incorporated herein by reference in its entirety.

The core network 112 connects to radio access network 110 over a radio access network interface depicted by dot-dashed line 122. The radio access network 110 includes one or more control nodes 126 and one or more radio base stations (BS) 128. In an example, non-limiting implementation in which radio access network 110 is a UMTS Terrestrial Radio Access Network (UTRAN), the radio access network interface depicted by dot-dashed line 122 is known as the Iu interface, and the control nodes 126 take the form of radio network controllers (RNCs). The person skilled in the art understands the function and constituency of radio network control node 126, such as a diversity handover unit, controller(s), IP header compression (which is distinct from SigComp), and various interfaces, for example. In other implementations of radio access network 110, the control nodes 126 can have other names, such as base station controller (BSC), radio network control node, etc. In any event, it should be understood that, for sake of simplicity, the radio access network 110 of FIG. 4 is shown with only one control node 126, with the control node 126 being connected to two base stations (BS) 128. As understood by those skilled in the art, the radio access network 110 typically has numerous control nodes 126, which can be connected over an unillustrated interface (such as an Iur interface).

Again for sake of simplicity, only two base station nodes 128 are shown connected to the representative control node 126. It will be appreciated that a different number of base stations 128 can be served by each control node 126, and that control nodes 126 need not serve the same number of base stations. Further, those skilled in the art will also appreciate that a base station is sometimes also referred to in the art as a radio base station, a node B, or B-node.

For brevity it is assumed in the ensuing discussion that each base station 128 serves one cell. It will be appreciated by those skilled in the art, however, that a base station may serve for communicating across the air interface for more than one cell. For example, two cells may utilize resources situated at the same base station site. Moreover, each cell may be divided into one or more sectors, with each sector having one or more cell/carriers.

A wireless terminal $24_W$ communicates with one or more cells or one or more base stations (BS) 128 over a radio or air interface 132. In differing implementations, the wireless terminal $24_W$ can be known by different names, such as remote terminal, mobile station or MS, mobile terminal or MT, or user equipment unit (UE), for example. Of course, whereas for ease of illustration only one wireless terminal $24_W$ is shown in FIG. 4, each base station typically serves many wireless terminals.

In the example UMTS implementation mentioned above, radio access is preferably based upon Wideband, Code Division Multiple Access (WCDMA) with individual radio channels allocated using CDMA spreading codes. Of course, other access methods may be employed.

Of particular interest herein is the fact that, for or in conjunction with services such as Push to talk over Cellular (PoC), the IP Multimedia Subsystem (IMS) 115 has the compressor $40_{IMS}$ which selectively updates its compressor dictionary $60_{IMS}$ in accordance with the techniques described above. In addition, the wireless terminal $24_W$ has a decompressor with selective dictionary updating, i.e., decompressor $50_W$. Preferably, the selective dictionary updating is employed in the context of the PoC-employed compression scheme known as SigComp, which compresses SIP messages. For simplicity when referring herein to Sig-Comp, it should be understood as the protocol SigComp in combination with a compression algorithm, such as Deflate, for example.

The structure and operation of compressor $40_{IMS}$ is essentially similar to that of generic, representative compressor $40_N$ described previously, and thus similarly includes update decision logic $62_{IMS}$ and an (optional) limit value $64_{IMS}$. The SigComp function 119 also includes a message formatter $34_{IMS}$, and other unillustrated constituent elements.

The decompressor $50_W$ provided for wireless terminal $24_W$ has similar structure and operation as the decompressor $50_T$ previously described with reference to remote terminal 24 of FIG. 1. For example, decompressor $50_T$ includes decompression dictionary $70_W$ and dictionary update determination logic $72_W$.

In the FIG. 4 system, Presence Server 117 is responsible for at least collecting information to include in Presence update messages that are to be sent to wireless terminal $30_W$ over the radio interface 132. The compressor $40_{IMS}$ compresses messages to obtain compressed messages to be sent over the radio interface to wireless terminal $30_W$. The update decision logic $62_{IMS}$ detects a Presence update message. The message formatter $34_{IMS}$ directs the compressed message of a Presence update message to include an update indication that will cause wireless terminal $30_W$ not to update decompression dictionary $70_W$ upon receipt of the Presence update message. Similarly, any compressed message versions of other suitable messages (e.g., those messages having a suitably high compression factor) are prepared to have an update indication that will cause wireless terminal $30_W$ not to update decompression dictionary $70_W$.

As in the generic embodiment, in the FIG. 4 example implementation the compressor $40_{IMS}$ of the PoC-compatible embodiment can operate by determining a compression factor for each of the messages based on similarity of each message to contents of a sending entity compression dictionary. In such implementation, the update decision logic $62_{IMS}$ can make a decision whether the compression factor justifies updating of the decompression dictionary $70_W$ of wireless terminal $30_W$. The message formatter $34_{IMS}$ includes in a respective compressed message the update indication regarding the decision. Then, at wireless terminal $30_W$, the update determination logic $72_W$ uses the update indication to ascertain whether to use the decompressed message to update decompression dictionary $70_W$.

Thus, as one aspect of operation, the techniques described above assure that the compression/decompression dictionaries are not updated if a received message is too similar to what is already in the dictionary. This similarity can be measured by the compression factor (F) obtained on the message. If the message can be compressed efficiently (e.g., has a high compression factor), this implies that the content in the dictionary is very similar to the message. If such case then there is no need to update the dictionary.

Hence, in at least some embodiments the technique bases the decision on whether to save a message in the dictionary on the obtained compression factor (F). If the compression factor is below some limit the message is used to update the dictionary. On the other hand, if the compression factor is above the same limit, the message is not used to update the dictionary. The compression factor is measured by the compressor 40 which then (via the UPDATE INDICTOR indicates to the decompressor 50 whether the message should be used to update the dictionary or not.

At least in the context of the PoC service, the indication (e.g., UPDATE INDICATOR) is preferably implemented as a bit flag or field of a SigComp message that is read by the UDVM, i.e., decompressor 50. Thus, decompressor 50 is instructed to read this field or bit flag, and depending on the value (0/1) of the field or bit flag, decompressor 50 may update the dictionary, i.e. save a new state, with the content of the current decompressed message.

The technique serves to increase compression performance when dynamic compression is used together with a service such as (for example) Presence. Increase of compression performance results in reduced set up times for push to talk sessions.

The technique is also advantageous for the following reasons:

Messages that are very similar to the contents of the dictionary, and hence are not useful for the compression performance, do not waste state memory since they are not saved.

The risk of pushing out useful contents of the dictionary and replacing it with multiple "copies" of the same message is minimized.

In scenarios with a SIP invite followed by a number of Presence updates the standard Dynamic compression would fill the dictionary with copies of presence updates. This would lead to bad compression performance when a new SIP invite dialogue is to be compressed. With the present technique such is not the case.

The technique is easy to implement compared to other dictionary update strategies, e.g. adding unmatched strings to the dictionary. The ease of implementation leads to shorter byte codes than would be needed for more complex strategies.

The technique can be used for different compression algorithms such as Deflate, LZSS and other. The technique does not depend on the compression algorithm, other than through the compression factor obtained.

The technique has particular importance for the proxy implementation, since this is the side that would issue the presence updates.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of operating a telecommunications network comprising a sending entity which communicates over a radio interface to a receiving entity, the method comprising:
   at the sending entity:
      compressing a message to obtain a compressed message to be sent over the radio interface to the receiving entity;
      determining a compression factor for the message based on similarity of the message to contents of a sending entity compression dictionary;
      making a decision whether the compression factor justifies updating of a receiving entity decompression dictionary;
      including in the compressed message an update indication regarding the decision;
   at the receiving entity, upon receipt of the compressed message:
      decompressing the compressed message to obtain a decompressed message; and
      using the update indication to ascertain whether to use the decompressed message to update the receiving entity decompression dictionary.

2. The method of claim 1, further comprising:
   using a SigComp compression scheme to compress the message to obtain the compressed message;
   including the update indication in a SigComp portion of the compressed message.

3. The method of claim 1, wherein the step of making the decision whether the compression factor justifies updating of the receiving entity decompression dictionary further comprises comparing the compression factor to a limit value.

4. The method of claim 3, wherein the limit value is a fixed value.

5. The method of claim 3, further comprising adapting the limit value in accordance with a compression history.

6. The method of claim 3, further comprising adapting the limit value based on an average compression factor over a period of time.

7. The method of claim 1, wherein the network provides a Push-to-talk over Cellular feature and further comprises a Presence Server which provides Presence update messages to a wireless receiving entity, wherein each of the Presence update messages has a status list for one or more parties of interest to the wireless receiving entity, the method further comprising the sending entity making a negative update decision for a Presence update message.

8. A method of operating a telecommunications network having a Push-to-talk over Cellular (PoC) feature, the network comprising a sending entity which communicates over a radio interface to a wireless receiving entity, the method comprising:
   at the sending entity:
      compressing messages to obtain compressed messages to be sent over the radio interface to the receiving entity;
      for a Presence update message of the PoC feature, including in the compressed message an update indication that a receiving entity decompression dictionary is not to be updated;
   at the receiving entity, upon receipt of the compressed messages:
      decompressing the compressed messages to obtain decompressed messages; and
      on the basis of the update indication, not updating the receiving entity decompression dictionary with respect to a Presence update messages.

9. The method of claim 8, further comprising, at the sending entity, the steps of:
   determining a compression factor for each of the message based on similarity of each message to contents of a sending entity compression dictionary;
   making a decision whether the compression factor justifies updating of a receiving entity decompression dictionary;
   including in a respective compressed message an update indication regarding the decision.

10. The method of claim 9, further comprising, at the receiving entity, the steps of:
   using the update indication to ascertain whether to use the decompressed message to update the receiving entity decompression dictionary.

11. The method of claim 9, further comprising:
   making the decision whether the compression factor justifies updating of the receiving entity decompression dictionary by comparing the compression factor to a limit value;
   setting the limit value whereby a negative update decision is made for a Presence update message.

12. The method of claim 8, further comprising:
using a SigComp compression scheme to compress the messages to obtain the compressed messages;
including the update indication in a SigComp portion of the compressed messages.

13. A telecommunications network comprising:
a sending entity;
a receiving entity which communicates over a radio interface with the sending entity;
wherein the sending entity comprises:
a sending entity compression dictionary;
a compressor which compresses a message to obtain a compressed message to be sent over the radio interface to the receiving entity and which determines a compression factor for the message based on similarity of the message to contents of the sending entity compression dictionary;
update decision logic which makes a decision whether the compression factor justifies updating of a receiving entity decompression dictionary;
a message formatter which includes, in the compressed message, an update indication regarding the decision;
wherein the receiving entity comprises:
the receiving entity decompression dictionary;
a decompressor which decompresses the compressed message to obtain a decompressed message; and
update determination logic which uses the update indication to ascertain whether to use the decompressed message to update the receiving entity decompression dictionary.

14. The apparatus of claim 13, wherein the compressor uses a SigComp compression scheme to compress the message to obtain the compressed message; and wherein the message formatter sets the update indication in a SigComp portion of the compressed message.

15. The apparatus of claim 13, wherein the update decision logic makes the decision whether the compression factor justifies updating of the receiving entity decompression dictionary further by comparing the compression factor to a limit value.

16. The apparatus of claim 15, wherein the limit value is a fixed value.

17. The apparatus of claim 15, wherein the update decision logic adapts the limit value in accordance with a compression history.

18. The apparatus of claim 15, wherein the update decision logic adapts the limit value based on an average compression factor over a period of time.

19. The apparatus of claim 13, wherein the network provides a Push-to-talk over Cellular feature and provides Presence update messages to a wireless receiving entity, wherein each of the Presence update messages has a status list for one or more parties of interest to the wireless receiving entity, and wherein the update decision logic makes a negative update decision for a Presence update message.

20. A telecommunications network which has a Push-to-talk over Cellular (PoC) feature, the network comprising:
a sending entity;
a receiving entity which communicates over a radio interface with the sending entity;
wherein the sending entity comprises:
a sending entity compression dictionary;
a compressor which compresses messages to obtain compressed messages to be sent over the radio interface to the receiving entity;
update decision logic which detects a Presence update message of the PoC feature;
a message formatter which includes, in the compressed message of a Presence update message, an update indication that a receiving entity decompression dictionary is not to be updated for the Presence update message;
wherein the receiving entity comprises:
the receiving entity decompression dictionary;
a decompressor which decompresses the compressed message to obtain a decompressed message; and
update determination logic which, on the basis of the update indication, does not update the receiving entity decompression dictionary with respect to the Presence update message.

21. The apparatus of claim 20, further comprising a Presence Server for generating the Presence update message to be sent to the receiving entity over the radio interface.

22. The apparatus of claim 20, wherein the compressor determines a compression factor for each of the message based on similarity of each message to contents of a sending entity compression dictionary; wherein the update decision logic makes a decision whether the compression factor justifies updating of a receiving entity decompression dictionary; and, wherein the message formatter includes in a respective compressed message the update indication regarding the decision.

23. The apparatus of claim 22, wherein the update determination logic uses the update indication to ascertain whether to use the decompressed message to update the receiving entity decompression dictionary.

24. The apparatus of claim 22, wherein the update decision logic makes the decision whether the compression factor justifies updating of the receiving entity decompression dictionary by comparing the compression factor to a limit value, and wherein the sending entity further comprises means for setting the limit value whereby a negative update decision is made for a Presence update message.

25. The apparatus of claim 20, wherein the compressor uses a SigComp compression scheme to compress the messages to obtain the compressed messages; and wherein the message formatter sets the update indication in a SigComp portion of the compressed messages.

26. A sending entity of a telecommunications network which communicates over a radio interface with a receiving entity; the sending entity comprising:
a sending entity compression dictionary;
a compressor which compresses a message to obtain a compressed message to be sent over the radio interface to the receiving entity and which determines a compression factor for the message based on similarity of the message to contents of the sending entity compression dictionary;
update decision logic which makes a decision whether the compression factor justifies updating of a receiving entity decompression dictionary;
a message formatter which includes, in the compressed message, an update indication regarding the decision.

27. The apparatus of claim 26, wherein the compressor uses a SigComp compression scheme to compress the message to obtain the compressed message; and wherein the message formatter sets the update indication in a SigComp portion of the compressed message.

28. The apparatus of claim 26, wherein the update decision logic makes the decision whether the compression factor justifies updating of the receiving entity decompression dictionary further by comparing the compression factor to a limit value.

29. The apparatus of claim 28, wherein the limit value is a fixed value.

30. The apparatus of claim 28, wherein the update decision logic adapts the limit value in accordance with a compression history.

31. The apparatus of claim 28, wherein the update decision logic adapts the limit value based on an average compression factor over a period of time.

32. The apparatus of claim 26, wherein the network provides a Push-to-talk over Cellular feature, wherein the sending entity provides Presence update messages to a wireless receiving entity, wherein each of the Presence update messages has a status list for one or more parties of interest to the wireless receiving entity, and wherein the update decision logic makes a negative update decision for a Presence update message.

33. A receiving entity of a telecommunications network which communicates over a radio interface with a sending entity; the receiving entity comprising:

a receiving entity decompression dictionary a transceiver which receives a compressed version of a message, the compressed message including an update indication which indicates whether a decompressed version of the message is to be used for updating the receiving entity decompression dictionary;

a decompressor which decompresses the compressed message to obtain a decompressed message; and update determination logic which uses the update indication to ascertain whether to use the decompressed version of the message to update the receiving entity decompression dictionary.

\* \* \* \* \*

UNITED STATES PATENT AND TRADEMARK OFFICE
CERTIFICATE OF CORRECTION

PATENT NO. : 7,348,904 B2
APPLICATION NO. : 10/974033
DATED : March 25, 2008
INVENTOR(S) : Christoffersson et al.

Page 1 of 1

It is certified that error appears in the above-identified patent and that said Letters Patent is hereby corrected as shown below:

In Fig. 4, Sheet 3 of 4, for Tag "$72_w$", in Line 1, delete "DETERMIN-ATION" and insert -- DETERMINATION --, therefor.

In Column 1, Line 27, delete "poc.htm," and insert -- poc.htm. --, therefor.

In Column 1, Line 61, delete "2000)," and insert -- 2000, --, therefor.

In Column 12, Line 61, delete "not." and insert -- not). --, therefor.

In Column 18, Line 5, in Claim 33, delete "dictionary" and insert -- dictionary; --, therefor.

Signed and Sealed this
Twelfth Day of February, 2013

Teresa Stanek Rea
*Acting Director of the United States Patent and Trademark Office*